United States Patent [19]

Jordan

[11] Patent Number: 5,004,975
[45] Date of Patent: Apr. 2, 1991

[54] ADJUSTABLE ELECTRONIC GRATICULES FOR MEASURING WAVEFORM DISTORTIONS

[75] Inventor: Dale A. Jordan, Hillsboro, Oreg.

[73] Assignee: Tektronix, Inc., Beaverton, Oreg.

[21] Appl. No.: 546,270

[22] Filed: Jun. 28, 1990

[51] Int. Cl.$^5$ .................. G01R 31/22; G01R 13/30
[52] U.S. Cl. .................. 324/121 R; 324/158 R; 324/115; 324/73.1; 364/487; 315/377
[58] Field of Search .................. 324/121 R, 77 A, 115; 364/487, 571; 315/377; 340/722, 709

[56] References Cited

U.S. PATENT DOCUMENTS

| | | | |
|---|---|---|---|
| 4,283,655 | 8/1981 | Mossman et al. | 324/121 R |
| 4,743,844 | 5/1988 | Odenheimer et al. | 324/121 R |
| 4,751,504 | 6/1988 | Slavin | 324/121 R |
| 4,761,640 | 8/1988 | Slavin | 324/121 R |
| 4,764,721 | 8/1988 | Slavin | 324/121 R |
| 4,924,175 | 5/1990 | Clinton | 324/121 R |

Primary Examiner—Kenneth Wieder
Assistant Examiner—Vinh P. Nguyen
Attorney, Agent, or Firm—Francis I. Gray

[57] ABSTRACT

Adjustable electronic graticules for measuring waveform distortions are generated from operator inputs indicating a measurement mode and a scale factor. A template of a graticule for the measurement mode in the form of a display list of move and draw instructions is scaled by the scale factor and a measurement value is computed from the scale factor and the instrument units per division setup. The graticule and measurement value are stored as a modified display list. A readout engine interprets the modified display list and produces electrical signals for drawing the graticule and measurement value on a display monitor. The electrical signals are combined with the waveform for display on the display monitor. The operator varies the scale factor until the displayed graticule touches the waveform at a measurement point, and the measurement value is accordingly displayed.

2 Claims, 3 Drawing Sheets

ADJUSTABLE ELECTRONIC GRATICULES FOR MEASURING WAVEFORM DISTORTIONS

BACKGROUND OF THE INVENTION

The present invention relates to user interfaces for measuring waveform distortions, and more particularly to adjustable electronic graticules for measuring waveform distortions to eliminate parallax errors and to eliminate the need for interpolation between fixed graticule marks.

A waveform monitor is a specialized form of an oscilloscope for making measurements of video waveforms in the television industry. Graticules generally are found in two forms on a cathode ray tube (CRT) used for waveform monitoring: internal fixed graticules on the CRT; and plastic overlays with fixed graticules for placing over the face of the CRT. Internal graticules only contain commonly used markings, while graticules for special measurements, such as waveform distortions, are relegated to plastic overlays to reduce the clutter for normal operation. In addition these external overlays come in two forms; one for normal viewing and one slightly reduced for photographic uses.

Some common television measurements performed using these special purpose graticules include K-Factor, ICPM (Incidental Carrier Phase Modulation) and short time distortion (SD). K-Factor measurements include the use of a submarine-shaped graticule to measure the distortion of a sine-squared pulse which generally has markings for two and five percent distortion values, with other values of distortion being interpolated visually by an operator from these values. ICPM graticules have straight lines extending radially outward from a zero carrier reference point, usually in the form of a family of markings spaced in two degree intervals. SD measurements require a complex graticule to measure the distortion of a sine-squared step waveform. Each video standard, such as NTSC, PAL, SECAM and the like, has its own definition of distortions and graticule shapes to measure these distortions, often resulting in the requirement for different graticules for each video standard for the same measurement.

As is readily apparent these external graticules are subject to parallax errors when used by an operator, as well as interpolation errors when the waveform falls between fixed graticule locations. What is desired are adjustable electronic graticules for measuring waveform distortions that do not clutter the screen when the measurement is not desired, yet when used eliminate parallax and interpolation errors to provide a more accurate measurement of the waveform distortions.

SUMMARY OF THE INVENTION

Accordingly the present invention provides adjustable electronic graticules for measuring waveform distortions that are displayed only when the specific measurement is desired. Templates of graticules in the form of display lists of move and draw commands are stored in a microprocessor accessible memory. To draw a particular graticule shape the microprocessor modifies a selected one of the display lists to alter the move and draw instructions appropriate for drawing the graticule. A readout engine processes the modified display list to draw the graticule on a CRT screen together with a waveform being measured. Adjustment of the graticule is via a front panel knob accessible to an operator. The microprocessor reads the knob setting and scales the appropriate move and draw instructions to produce the modified display list to set the graticule to the appropriate size. An alphanumeric readout display shows the current scale setting or measurement readout.

The objects, advantages and other novel features of the present invention are apparent from the following detailed description when read in conjunction with the appended claims and attached drawing.

DESCRIPTION OF THE PREFERRED EMBODIMENT

Figure 1:
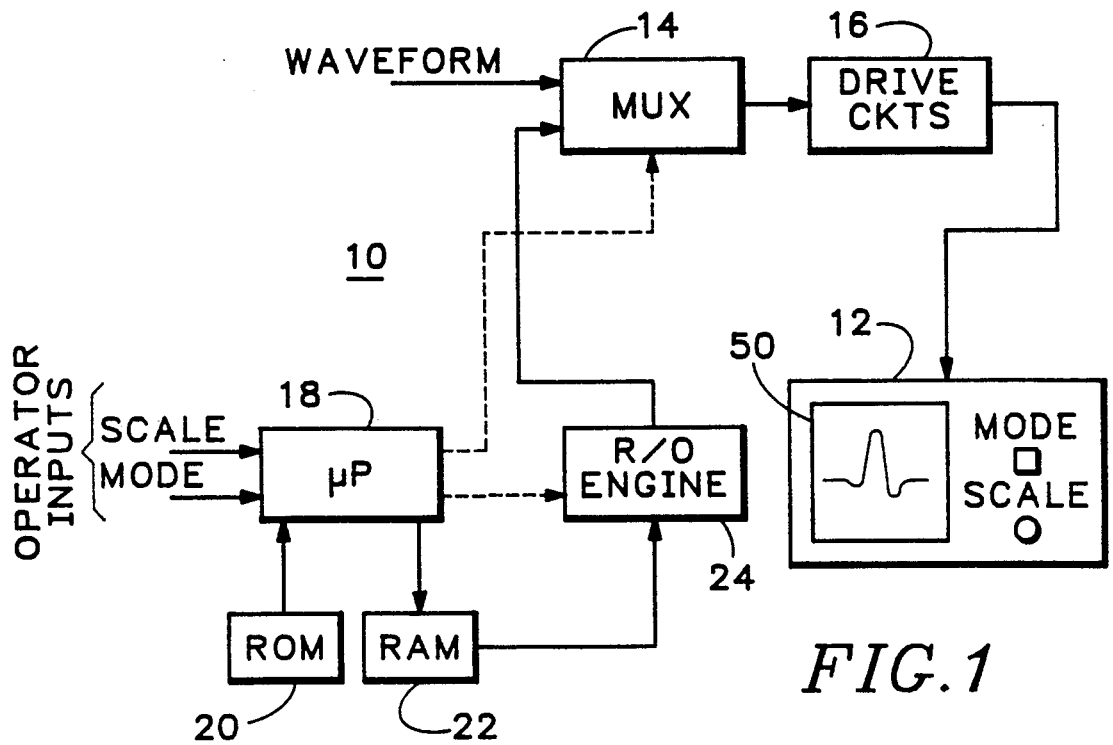
FIG. 1 is a block diagram of an instrument for measuring waveform distortions according to the present invention.

Referring now to FIG. 1 a waveform measuring instrument 10, such as an oscilloscope or waveform monitor, is shown having a display monitor 12, such as a cathode ray tube (CRT), upon which a waveform to be measured is displayed together with appropriate graticules to assist in measuring properties of the waveform. The waveform is input via a multiplexer 14 to appropriate drive circuits 16 to produce the desired display on the display monitor 12, as is conventional. A microprocessor 18 receives various inputs from an operator, such as a measurement mode and a scale factor parameter. According to the measurement mode the microprocessor 18 accesses from a read only memory (ROM) 20 an appropriate display list of move and draw instructions to perform the selected measurement. The information to be displayed is processed and input to a random access memory (RAM) 22 in the form of a modified display list. The modified display list from the RAM 22 is accessed by a readout engine 24 that converts the display list into electrical signals that are input to the multiplexer 14 to draw the graticule and corresponding measurement value on the display monitor 12. The readout engine 24 is controlled by the microprocessor 18 which tells the readout engine when there is new data in the RAM 22, and when to provide the electrical signals to the multiplexer 14. The microprocessor 18 also controls the multiplexer 14 so that the waveform and electrical signals from the readout engine 24 are combined to present to the display monitor 12 an apparently simultaneous display of the waveform and electrical signals representing electronic graticules and alphanumeric information, i.e., the electronic graticules and alphanumeric information are time multiplexed with the waveform.

Figure 2:
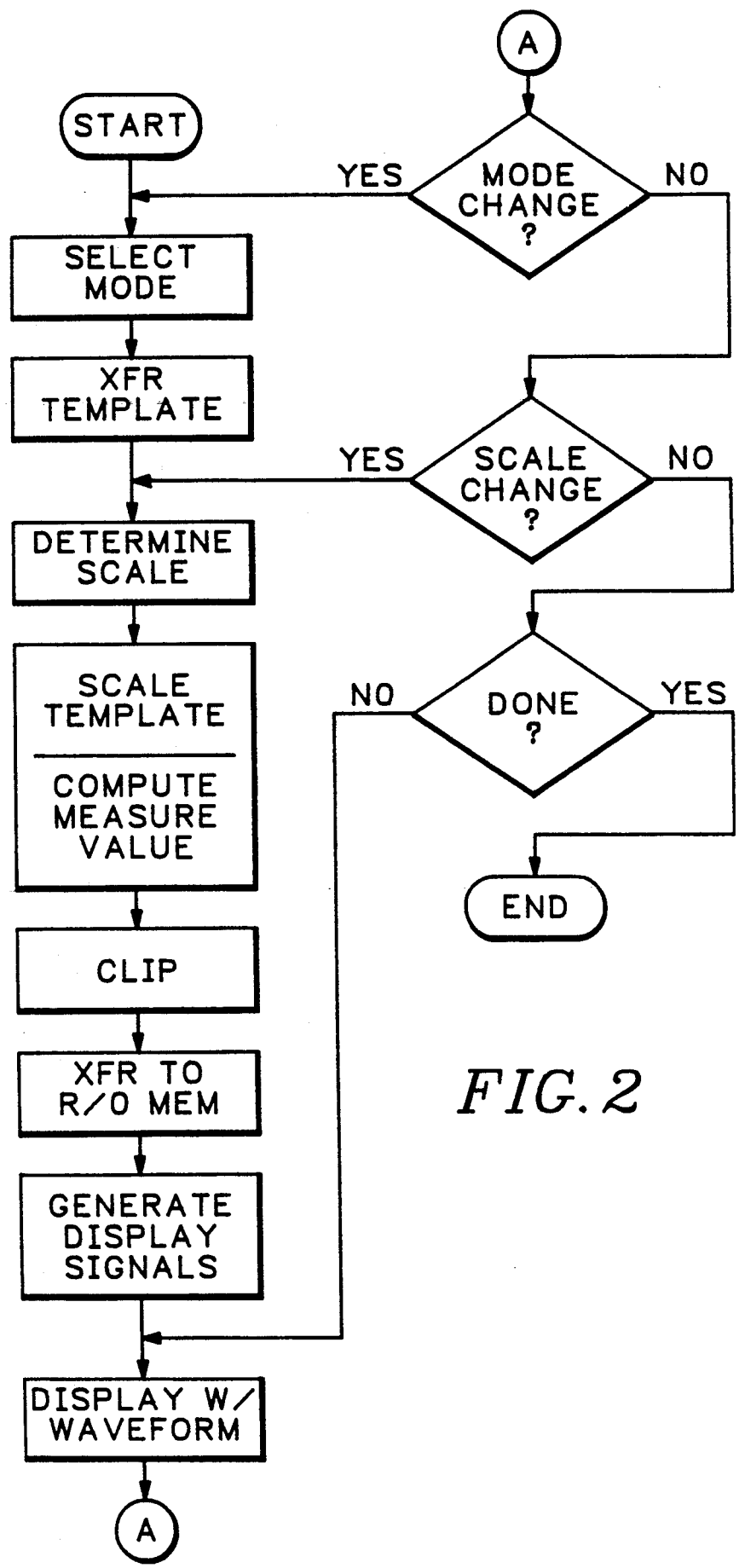
FIG. 2 is a flow diagram for generating adjustable electronic graticules for the instrument of FIG. 1 according to the present invention.

As shown in FIG. 2 when a measurement is started the microprocessor 18 determines what measurement program to access from the ROM 20 according to a measurement mode selected by an operator, usually by push button selection on a front panel of the instrument 10. For adjustable electronic graticules according to the present invention an appropriate template of the graticule for the measurement mode selected in the form of a display list of move and draw instructions together with the measurement program is transferred to the microprocessor 18 for processing. The template is scaled according to operator input from the front panel, such as the angular rotation of a knob, and from the scale factor and the instrument setup of units per division on the display monitor 12 a measurement value is calculated. A clip function is accessed to test the scaled template to determine whether any part of it falls outside the available display area of the display monitor 12 and clips the values accordingly. The scaled, and clipped if necessary, template and the measurement value are transferred to the RAM 22 in the form of the modified display list. From the display list the readout engine, which typically is a state machine, generates the electrical signals that represent the graticule and measurement values for display, as is well known in the art. The electrical signals are displayed on the display monitor 12 together with the waveform. So long as there is no scale factor or measurement mode change, the graticule and measurement value continue to be displayed on the display monitor 12. If the operator manipulates the knob on the front panel to change the scale factor, then the microprocessor 18 goes back to obtain the new scale factor and rescale the template and recalculate the measurement value. The resultant new modified display list is loaded into the RAM 22, and the microprocessor 18 indicates to the readout engine 24 to generate a new display. If there is a mode change, then the microprocessor 18 goes back to access the new measurement mode program and associated graticule template from ROM 20 and the process is repeated as described above.

Figure 3:
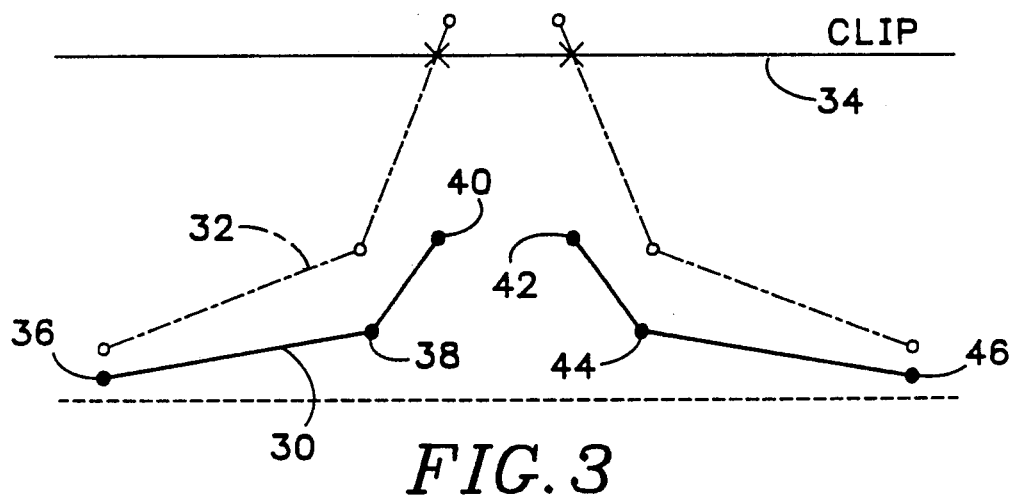
FIG. 3 is a screen illustration of the scaling of the electronic graticules according to the present invention.

FIG. 3 represents a scaling operation where the original electronic graticule 30 is scaled up, i.e., magnified, by changing the instrument setup. In this instance the highest points of the new graticule 32 exceed the upper limit of the display screen as indicated by the clip level 34. The resultant display list would only include the line draw for the last line segment of the graticule up to the clip level. The graticule, and measurement value, are graphically represented as vectors and generated by the move and draw instructions. The move instruction locates an XY location from which to start drawing a line, and a draw instruction causes a line to be drawn between a start point and an end point. For the portion of the graticule 30 shown in FIG. 3 a move instruction indicates the first start point 36, then subsequent draw instructions draw lines between points 36-38 and 38-40. Another move instruction moves from point 40 to point 42, and subsequent draw instructions complete the template of the graticule from point 42 to 44 to 46. Change of the scale factor by the operator affects only the Y-coordinate in the modified display list.

Figure 4:
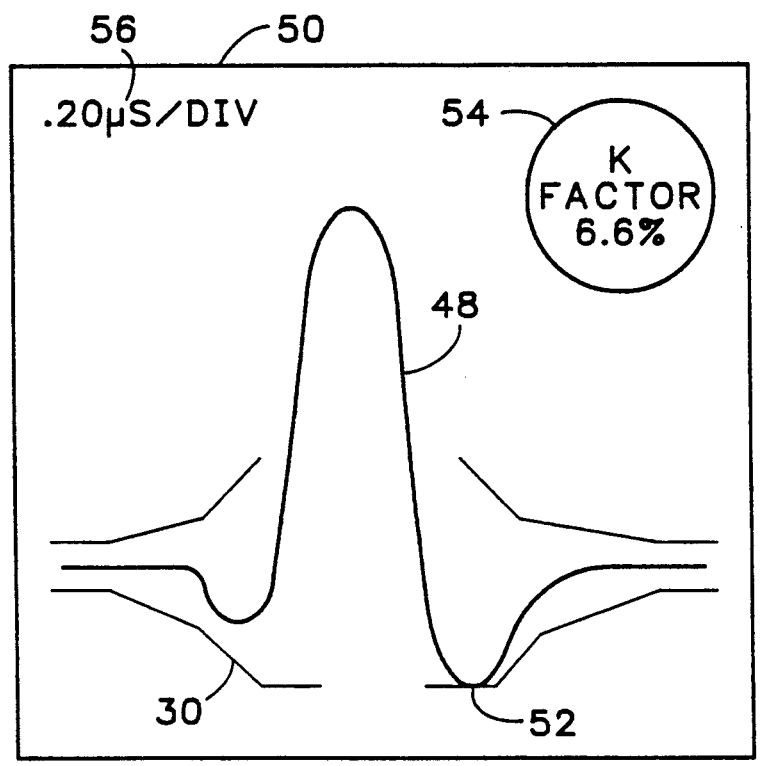
FIG. 4 is a screen illustration of performing a measurement of waveform distortions using adjustable electronic graticules according to the present invention.

In operation a waveform 48 is displayed on the screen 50 of the display monitor 12 as shown in FIG. 4. Also displayed is the electronic graticule 30. The operator adjusts the scale factor for the graticule until the graticule contacts any portion of the waveform 48, such as at point 52. The measurement value and the measurement type are displayed 54 together with the instrument setup in terms of units per division 56 of the fixed graticule on the display monitor 12. In this manner the operator can obtain an accurate measurement of the distortions of the waveform 48 without the need for inaccurate interpolations between fixed graticule lines and without any parallax errors.

Although the present invention is described in terms of display lists of move and draw instructions, any other type of template representation for the graticules that are readily amenable to selection and adjustment in response to mode and scale selections may be used.

Thus the present invention provides adjustable electronic graticules for measuring waveform distortions by retrieving a stored template according to the measurement mode and scaling the template for display according to operator input, the operator scaling the template until the graticule on the display touches the point on the waveform to be measured.

What is claimed is:

1. An apparatus for measuring distortions of a waveform using adjustable electronic graticules comprising:
   means for generating a display list based upon operator inputs of measurement mode and scale factor that represents a graticule and a measurement value;
   means for generating from the display list electronic signals for the graticule and the measurement value; and
   means for displaying the graticule and the measurement value together with the waveform.

2. A method of measuring distortions of a waveform using adjustable electronic graticules comprising the steps of:
   generating a display list based upon operator inputs of measurement mode and scale factor that represents a graticule and a measurement value;
   generating from the display list electronic signals for the graticule and the measurement value; and
   displaying the graticule and the measurement value together with the waveform.

* * * * *